(12) United States Patent
Hsieh et al.

(10) Patent No.: US 11,495,384 B2
(45) Date of Patent: Nov. 8, 2022

(54) COMMON MODE FILTER FOR REDUCING DIFFERENTIAL MODE SIGNAL CONVERTING TO COMMON MODE SIGNAL

(71) Applicant: TAI-TECH ADVANCED ELECTRONICS CO., LTD., Taoyuan (TW)

(72) Inventors: Ming-Yen Hsieh, Taoyuan (TW); Pao Lin Shen, Taoyuan (TW); Hsiang Chung Yang, Taoyuan (TW)

(73) Assignee: TAI-TECH ADVANCED ELECTRONICS CO., LTD., Taoyuan (TW)

( * ) Notice: Subject to any disclaimer, the term of this patent is extended or adjusted under 35 U.S.C. 154(b) by 880 days.

(21) Appl. No.: 16/382,232

(22) Filed: Apr. 12, 2019

(65) Prior Publication Data

US 2020/0328020 A1  Oct. 15, 2020

(51) Int. Cl.
*H01F 17/04* (2006.01)
*H03H 7/42* (2006.01)
*H03H 1/00* (2006.01)
*H01F 17/00* (2006.01)

(52) U.S. Cl.
CPC ............ *H01F 17/045* (2013.01); *H03H 1/00* (2013.01); *H03H 7/427* (2013.01); *H01F 2017/0093* (2013.01); *H03H 2001/005* (2013.01); *H03H 2001/0092* (2013.01)

(58) Field of Classification Search
CPC ........ H03H 7/427; H03H 7/0115; H03H 7/09; H01F 17/045
USPC ......................................... 333/177, 181, 185
See application file for complete search history.

(56) References Cited

U.S. PATENT DOCUMENTS

2019/0392973 A1* 12/2019 Hashimoto ........... H01F 17/045

* cited by examiner

*Primary Examiner* — Rakesh B Patel
(74) *Attorney, Agent, or Firm* — Leong C. Lei

(57) ABSTRACT

A common mode filter for reducing differential mode signal converting to common mode signal comprising: a core-cylinder, a first coil, and a second coil; wherein two ends of the core-cylinder respectively extend and set with a first flange and a second flange; wherein $m_1$, $m_2$, and $m_3$ turns and $n_1$, $n_2$, and $n_3$ turns are respectively and sequentially wound and set on the first winding portion, the second winding portion, and the third winding portion of the first winding area, the second winding area, and the third winding area of the first coil and the second coil. Therefore, the present invention can effectively reduce the mode conversion characteristic (Scd), and can also improve the noise reduction performance of the product; thereby greatly upgrading the practicality of the present invention; and the present invention has a simple process, therefore the product yield can be further upgraded to achieve the effect.

4 Claims, 1 Drawing Sheet

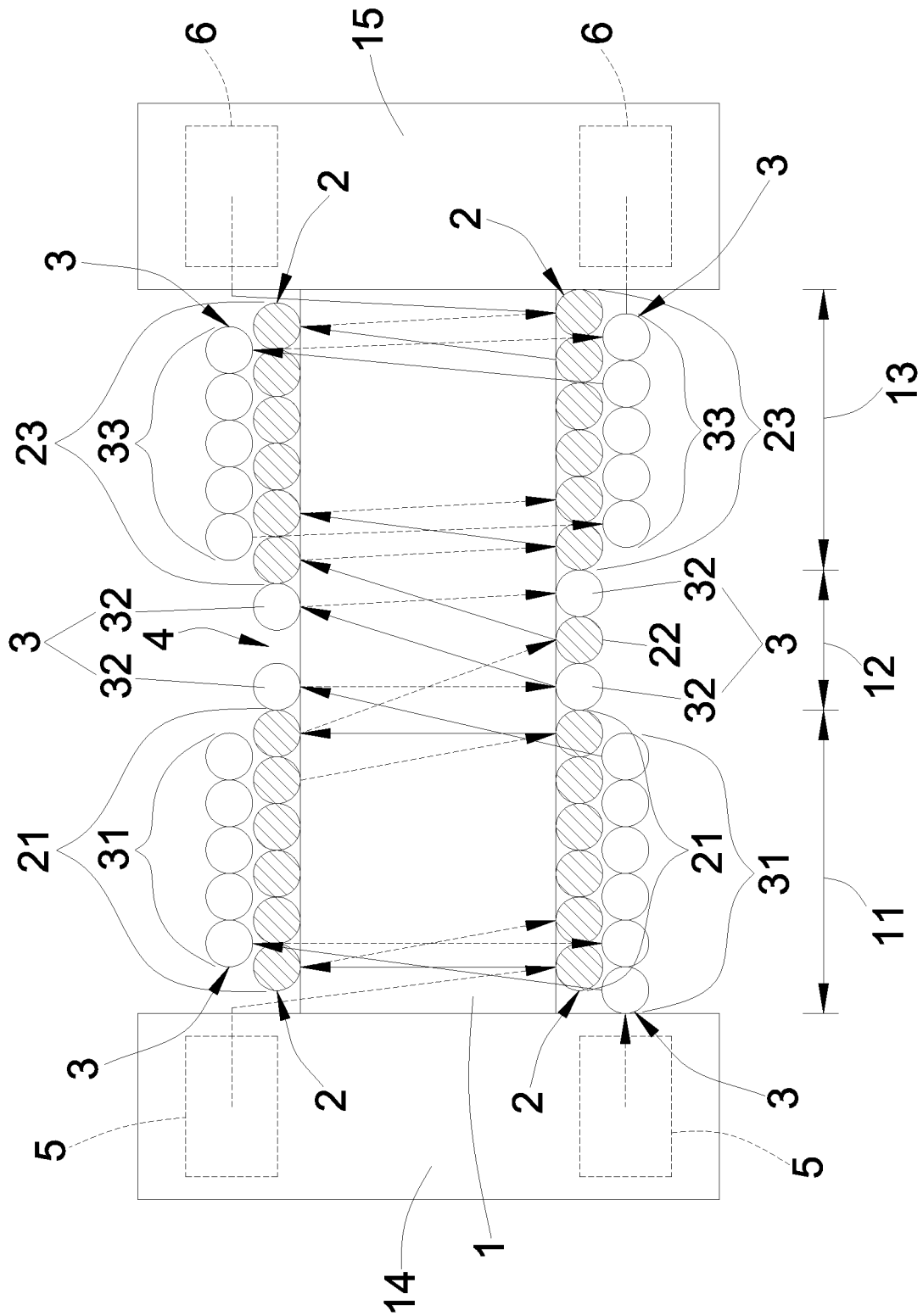

COMMON MODE FILTER FOR REDUCING DIFFERENTIAL MODE SIGNAL CONVERTING TO COMMON MODE SIGNAL

(a) TECHNICAL FIELD OF THE INVENTION

The present invention is a common mode filter, and especially relates a common mode filter for reducing differential mode signal converting to common mode signal.

(b) DESCRIPTION OF THE PRIOR ART

An ordinary common mode filter is mainly provided with a first coil and a second coil wound around an iron core, and the ends of the first coil and the second coil are respectively connected with the terminal electrodes of the iron core. The filtering principle is that when a noise current such as a common mode current passes through the common mode filter, the common mode current generates a magnetic field in the same direction on the first coil and the second coil; thereby increasing the inductive reactance of the first coil and the second coil. By making the common mode filter appear as high impedance, a high common mode impedance can be generated, and the common mode current can be attenuated, thereby achieving the purpose of filtering out common mode noise.

However, the existing common mode filter has a problem that the mode conversion characteristic (also known as Scd) is high when the differential mode signal converts to the common mode signal; that is, after the differential mode signal is input to the common mode filter, a higher proportion of the differential mode signal is converted into a common mode signal (noise) and output; as a result, the existing common mode filter cannot achieve better noise reduction performance.

SUMMARY OF THE INVENTION

To achieve the object of better noise reduction performance, the present invention provides a common mode filter for reducing differential mode signal converting to common mode signal; which comprises: a core-cylinder, wherein the core-cylinder is sequentially set with a first winding area, a second winding area, and a third winding area; wherein two ends of the core-cylinder respectively extend and set with a first flange and a second flange; a first coil, which is respectively and sequentially wound and set with $m_1$, $m_2$, and $m_3$ turns on the first winding portion of the first winding area, the second winding portion of the second winding area, and the third winding portion of the third winding area; and a second coil, which is adjacent to the first coil and is respectively and sequentially wound and set with $n_1$, $n_2$, and $n_3$ turns on the fourth winding portion of the first winding area, the fifth winding portion of the second winding area, and the sixth winding portion of the third winding area; wherein the $m_1+m_2+m_3$ turns are equal to the $n_1+n_2+n_3$ turns, wherein the fifth winding portion of the second winding area is set with an isolation region between two winding turns.

Preferably, the first winding portion and the fourth winding portion of the first winding area are formed to be stacked one on another, and the second winding portion and the fifth winding portion of the second winding area are formed to be horizontally wound and set respect to each other; wherein the third winding portion and the sixth winding portion of the third winding area are formed to be stacked one on another.

Preferably, the last turn of the third winding portion is contacted and set on the second flange and the first turn of the fourth winding portion is contacted and set on the first flange.

Preferably, the second winding portion and the fifth winding portion of the second winding area are alternately and horizontally wound and set respect to each other.

Preferably, the $m_1+m_2+m_3$ turns are equal to the $m+n_2+n_3$ turns and are equal to 13 turns.

Therefore, the present invention can effectively reduce the mode conversion characteristic (Scd), and can also improve the noise reduction performance of the product; thereby greatly upgrading the practicality of the present invention; and the present invention has a simple process, therefore the product yield can be further upgraded to achieve the effect.

BRIEF DESCRIPTION OF THE DRAWINGS

FIG. 1 is a top view schematic diagram of the structure of the preferred embodiment of the present invention.

DETAILED DESCRIPTION OF THE PREFERRED EMBODIMENTS

The following descriptions are exemplary embodiments only, and are not intended to limit the scope, applicability or configuration of the invention in any way. Rather, the following detailed description provides a convenient illustration for implementing exemplary embodiments of the invention.

Various changes to the described embodiments may be made in the function and arrangement of the elements described without departing from the scope of the invention as set forth in the appended claims.

The foregoing and other aspects, features, and utilities of the present invention will be best understood from the following detailed description of the preferred embodiments when read in conjunction with the accompanying drawings.

Please refer to FIG. 1, the present invention provides a common mode filter for reducing differential mode signal converting to common mode signal; which comprises: core-cylinder 1, a first coil 2 and a second coil 3; wherein the core-cylinder 1 is sequentially set with a first winding area 11, a second winding area 12, and a third winding area 13; wherein two ends of the core-cylinder 1 respectively extend and set with a first flange 14 and a second flange 15, and the flange is called flange or frame; wherein the core-cylinder 1, the first flange 14 and the second flange 15 are formed as an I-font shaped iron core.

In this embodiment, the first coil 2 and the second coil 3 can be wound around on the first winding area 11, the second winding area 12, and the third winding area 13 of the core-cylinder 1 by bifilar winding, and all of them have changes; which are further explained as follows.

The first coil 2 is respectively and sequentially wound and set with $m_1$, $m_2$, and $m_3$ turns on the first winding portion 21 of the first winding area 11, the second winding portion 22 of the second winding area 12, and the third winding portion 23 of the third winding area 13; wherein the second coil 3 is adjacent to the first coil 2, and similarly, which is respectively and sequentially wound and set with $n_1$, $n_2$, and $n_3$ turns on the fourth winding portion 31 of the first winding area 11, the fifth winding portion 32 of the second winding area 12, and the sixth winding portion 33 of the third winding area 13; wherein the $m_1+m_2+m_3$ turns are equal to the $n_1+n_2+n_3$ turns, that is, the number of turns of both of them is the same, if the $m_1+m_2+m_3$ turns are equal to 13 turns, then the $n_1+n_2+n_3$ turns is also equal to 13 turns; wherein the fifth winding portion 32 of the second winding area 12 is set with an isolation region 4 between two winding turns; in this embodiment, which is set between the sixth and seventh turns, thereby allowing the coil to be interposed between the coils to reduce the parasitic capacitance generated by contact.

Preferably, the first winding portion 21 and the fourth winding portion 31 of the first winding area 11 are formed to be stacked one on another, and the second winding portion 22 and the fifth winding portion 32 of the second winding area 12 are formed to be horizontally (interleavedly, alternately) wound and set respect to each other; and the third winding portion 23 and the sixth winding portion 33 of the third winding area 13 are formed to be stacked one on another; and if the number of interval turns of the interleaved winding is less, the effect for improving the mode conversion characteristic (Scd) of the common mode filter of the present invention is better, and the setting of stacking winding can also be used to reduce the volume.

Ideally, the first coil 2 and the second coil 3 should be interleaved every turn; however, if each turn is interleavedly wound (only the second winding portion 22 and the fifth winding portion 32 are interleaved in the present invention); when winding, different windings will easily cause overlapping-line problems with mutual interference; thereby affecting the product quality or yield; at the same time, the winding operation time is greatly increased, the manufacturing is difficult, and the production efficiency is lowered; but the present invention can avoid these problems and can provide a good Scd; therefore, the present invention is the best solution in the practice to balance product performance, quality and production efficiency.

In addition, the last turn (13th turn) of the third winding portion 23 is contacted and set on the second flange 15 and the first turn of the fourth winding portion 31 is contacted and set on the first flange 14; all of them are formed a setting leaning against each other; so that the off-line can all be avoided on the winding operation and after the winding completion, thereby upgrading the product yield.

To sum up, therefore the present invention can effectively reduce the mode conversion characteristic (Scd), and can also improve the noise reduction performance of the product; thereby greatly upgrading the practicality of the present invention; and the present invention has a simple process, therefore the product yield can be further upgraded to achieve the effect.

We claim:

1. A common mode filter comprising:
   a core-cylinder, wherein the core-cylinder is sequentially set with a first winding area, a second winding area, and a third winding area; wherein two ends of the core-cylinder respectively extend and set with a first flange and a second flange;
   a first coil, which is respectively and sequentially wound and set with $m_1$, $m_2$, and $m_3$ turns on a first winding portion of the first winding area, a second winding portion of the second winding area, and a third winding portion of the third winding area; and
   a second coil, which is adjacent to the first coil and is respectively and sequentially wound and set with $n_1$, $n_2$, and $n_3$ turns on a fourth winding portion of the first winding area, a fifth winding portion of the second winding area, and a sixth winding portion of the third winding area; wherein the $m_1+m_2+m_3$ turns are equal to the $n_1+n_2+n_3$ turns, wherein the fifth winding portion of the second winding area is set with an isolation region between two winding turns; wherein the $m_1+m_2+m_3$ turns are equal to 13 turns, and the $n_1+n_2+n_3$ turns are equal to 13 turns.

2. The common mode filter according to claim 1, wherein the first winding portion and the fourth winding portion of the first winding area are formed to be stacked one on another, and the second winding portion and the fifth winding portion of the second winding area are formed to be horizontally wound and set respect to each other; wherein the third winding portion and the sixth winding portion of the third winding area are formed to be stacked one on another.

3. The common mode filter according to claim 2, wherein the last turn of the third winding portion is contacted and set on the second flange and the first turn of the fourth winding portion is contacted and set on the first flange.

4. The common mode filter according to claim 2, wherein the second winding portion and the fifth winding portion of the second winding area are alternately and horizontally wound and set respect to each other.

* * * * *